United States Patent [19]

Schade, Jr.

[11] 4,361,815
[45] Nov. 30, 1982

[54] OPERATIONAL AMPLIFIER WITH PROGRAMMABLE GAIN

[75] Inventor: Otto H. Schade, Jr., North Caldwell, N.J.

[73] Assignee: RCA Corporation, New York, N.Y.

[21] Appl. No.: 164,682

[22] Filed: Jun. 30, 1980

[51] Int. Cl.[3] ............................................. H03G 3/30
[52] U.S. Cl. ................................. 330/254; 330/257; 330/278; 330/288
[58] Field of Search ............... 330/253, 254, 257, 278, 330/288; 307/297; 323/315, 316, 317

[56] References Cited

U.S. PATENT DOCUMENTS

| | | | |
|---|---|---|---|
| 3,921,090 | 11/1975 | Wheatley, Jr. et al. | 330/257 |
| 4,064,506 | 12/1977 | Cartwright, Jr. | 340/347 DA |
| 4,117,416 | 9/1978 | Schade, Jr. | 330/282 |
| 4,160,944 | 7/1979 | Ahmed | 323/4 |

OTHER PUBLICATIONS

Wittlinger, H. A. "Applications of the CA3080 and CA3080A High-Performance Operational Transconductance Amplifiers", ICAN-6668, *RCA Linear Integrated Circuits*, SSD-202C, 1975, pp. 411–426.
Intersil, Inc., "ICL761X, 762X, 763X, 764X Low Power MAXMOS Operational Amplifiers", 1979, pp. 1-5 and 12-13.

*Primary Examiner*—James B. Mullins
*Attorney, Agent, or Firm*—Eugene M. Whitacre; Paul J. Rasmussen; Clement A. Berard, Jr.

[57] ABSTRACT

An operational amplifier includes a differential-input amplifier stage supplying first and second drive currents responsive to input signals applied to its input connections. A first current amplifier exhibiting gain factor G supplies currents to an output terminal responsive to the first drive current, and a second current amplifier exhibiting gain factor H supplies currents to that output terminal responsive to the second drive current. Each of the first and second current amplifiers includes means for switching the value of its respective gain factor G or H between a plurality of values responsive to a control signal, so the gain of the operational amplifier is programmable responsive to the control signal.

24 Claims, 7 Drawing Figures

OPERATIONAL AMPLIFIER WITH PROGRAMMABLE GAIN

This invention relates to operational amplifiers of a type wherein gain is programmable between a plurality of values responsive to a control signal.

A conventional operational amplifier has an output terminal providing output signals responsive to the difference between input signals applied between its input terminals. Such amplifiers exhibit gains between their input and output terminals of predetermined values determined by the amplifier design. An operational transconductance amplifier (OTA), one species of operational amplifier, exhibits a transconductance (ratio of output-current-to-input-voltage change) programmable responsive to a bias current $I_{ABC}$ which establishes the tail current withdrawn from the interconnected emitters of transistors connected in long-tailed-pair configuration as the input stage. OTA's are described in detail by H. A. Wittlinger in "Applications of the CA3080 and CA3080A High-Performance Operational Transconductance Amplifiers", RCA ICAN-6668 Application Note, *RCA Linear Integrated Circuits Data Book*, SSD-202C, 1975, p. 411-26.

The transconductance of an OTA is a function of $I_{ABC}$ so it is often difficult to achieve precise values or a precise ratio of gains. The degree of difficulty increases as the ratio of the desired gain values departs from unity.

The present inventor observes that, generally speaking, one solution to such problems is an amplifier the gain of which is switched between a plurality of predetermined discrete values responsive to a control signal, the magnitude of which is not critical. Then, the control signal can be a digital level when two discrete gain values are desired or a digital word when more than two such values are desired.

An operational amplifier according to the present invention includes a differential-input amplifier stage supplying first and second drive currents responsive to input signals applied between its input terminals. A first current amplifier supplies current from a first supply voltage terminal to an output terminal responsive to the first drive current and related thereto by a gain factor G, G being any of a plurality of positive numbers. A second current amplifier supplies current between a second supply voltage terminal and the output terminal responsive to the second drive current and related thereto by a gain factor H, H being any of a plurality of positive numbers. Each of the first and second current amplifiers includes respective switch means for switching its respective gain factor G or H among the plurality of its values responsive to a control signal.

Figure 1:
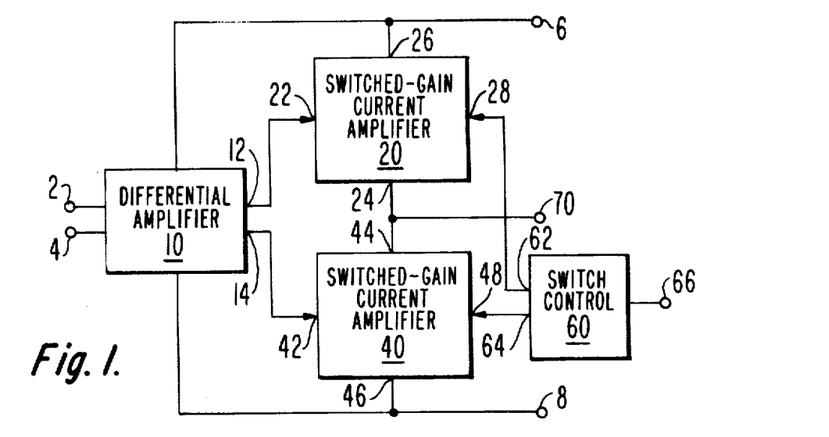
FIGS. 1, 2, 3, 4 and 5 are schematic diagrams of operational amplifiers with digitally programmable gain.

In the FIG. 1 OTA with digitally programmable gain, differential amplifier 10 supplies first and second drive currents from output connections 12 and 14, respectively, responsive to the difference between input signals received at differential-input connections 2 and 4. Amplifier 10 receives operating potential from supply voltage terminals 6 and 8; in specific OTA embodiments, either of the supply connections can be provided through switched-gain current amplifiers 20 and 40.

Switched-gain current amplifier 20 supplies current from supply terminal 6 to output terminal 70 via supply connection 26 and output connection 24, responsive to drive current received at its input connection 22. The gain G of current amplifier 20 is switched responsive to control signals received at control connection 28.

Switched-gain current amplifier 40 conducts current between output terminal 70 and supply terminal 8 via output connection 44 and supply connection 46 responsive to drive current received at its input connection 42. The gain —H of current amplifier 40 is switched responsive to control signals received at control input 48.

Control signals to current amplifiers 20 and 40 are supplied from control output connections 62 and 64, respectively, of switch control 60 responsive to control input signals applied at control input terminal 66. Usually, the control input signals are applied so as to make G and H equal each other as they are programmed between one of their respective values and another; in this way the FIG. 1 OTA is made to exhibit common-mode signal rejection for each value of G and H.

Figure 2:
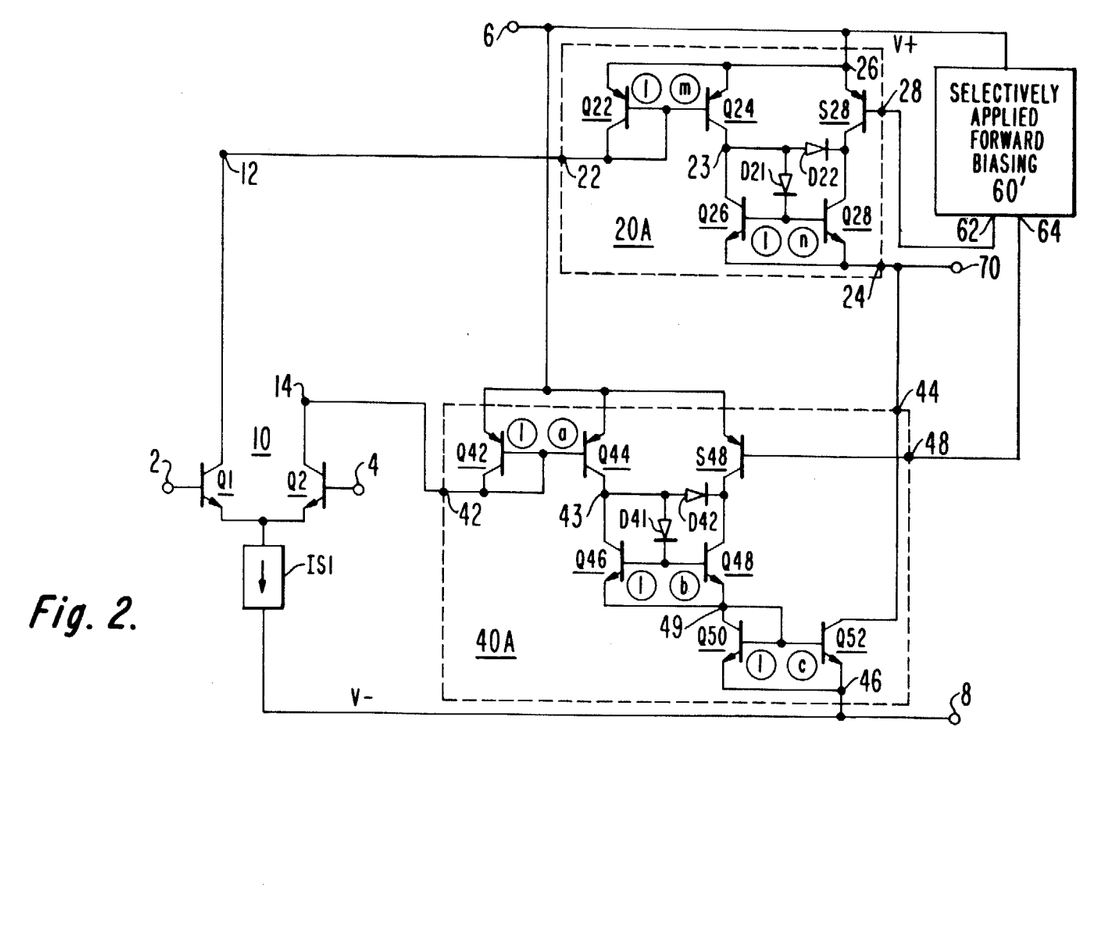

In the more specific circuit of FIG. 2, transistors Q1 and Q2 in long-tailed-pair connection serve as differential-input amplifier 10, responding to input signals received at terminals 2 and 4 and applied between their respective base electrodes, to provide drive currents at their respective collector electrodes, which respectively connect to output connections 12 and 14 of amplifier 10. Emitter bias current for Q1 and Q2 is supplied by current source IS1 returned to a relatively negative supply voltage V— rail connecting to supply terminal 8.

Switched-gain current amplifier 20A receives drive current at the input connection 22 of a current mirror amplifier (CMA) formed by input transistor Q22 and output transistor Q24. The current gain of this CMA as between its input connection 22 and its output connection at the collector of Q24 is —m, as determined by the ratio of the emitter areas of Q24 and Q22, which areas are represented by the encircled characters proximate to the transistors in the drawings. Collector current from Q24 is applied to the input connection 23 of a further CMA including input transistor Q26 and output transistor Q28. The output connection of this further CMA is selectively connected via switch S28 to a relatively positive operating voltage V+ rail 26 connecting to terminal 6, and the common connection 24 of this further CMA is to output terminal 70 of the FIG. 2 operational amplifier.

Assuming switch S28 to be nonconductive, collector current from Q24 flows unchanged to output connection 24 through the collector-emitter conduction path of Q26, diode D21 and the base-emitter paths of Q26 and Q28, and diode D22 and the collector-emitter conduction path of Q28. It is unimportant by which path that current flows, the important feature being that the current gain between the collector of Q24 and output connection 24 is unity, when switch S28 is nonconductive. This has to be so, and circuit potentials will adjust accordingly, to satisfy Kirchoff's current law.

On the other hand, when forward bias selectively applied by source 60' renders switch S28 (shown by way of example as a PNP bipolar transistor) conductive, diode D22 is reversed-biased and transistors Q26 and Q28 function as a CMA, the collector current in Q28 being n times the collector current in Q26. Those collector currents are summed at output connection 24 together with the base currents supporting them. These base currents are generally negligibly small compared to the collector currents, so that the current at output connection 24 is $(1+n)$ times the current applied to input connection 23.

Current amplifier 20A exhibits gain factor $G=m$ when switch S28 is nonconductive, and exhibits gain factor $G=m(1+n)$ when S28 is rendered conductive responsive to a control signal.

Switched-gain current amplifier 40A includes elements Q42, Q44, Q46, Q48, D41, D42, and S48 corresponding respectively to elements Q22, Q24, Q26, Q28, D21, D22 and S28 of switched-gain current amplifier 20A and further includes a still further CMA with current gain substantially equal to $-c$ in cascade thereafter. This still further CMA includes an input transistor 50 and output transistor 52 which conducts current between output terminal 70 and supply terminal 8. The current gain between node 42 and terminal 70 is switched between the values $H=ac$ and $H=ac(1+b)$ responsive to control signals selectively supplied to switch S48 at its base from selectively applied forward biasing source 60'. In most cases the emitter areas of corresponding transistors in current amplifiers 20A and 40A would be made equal so that the respective current gains between connections 12 and 14 and output terminal 70 are equal. E.g., with $m=a=5$, $n=b=9$, and $c=1$, the absolute values of the current gains of current amplifiers 20A and 40A are switchable between the values 5 and 50 responsive to control signals rendering switches S28 and S48 selectively conductive.

The similarity between the configuration of switched-gain current amplifiers 20A and 40A desirably allows closely matched transistor characteristics therebetween when the amplifier of FIG. 2 is constructed as a monolithic integrated circuit. For example, transistors Q22, Q24, Q42, and Q44 might be formed as lateral PNP bipolar transistors which tend to have relatively low common-emitter forward current gain which tends to introduce base-current errors when those transistors are used in a CMA. Due to the similarity between current amplifiers 20A and 40A, the areas will be closely matched and therefore have no significant effect upon the ratio of their respective current gains.

In FIG. 2, switches S28 and S48 are PNP transistors arranged for selectively connecting the collectors of Q28 and Q48, respectively, to supply voltage V+ responsive to control signals at connections 62 and 64 from selectively applied forward biasing source 60'. In this embodiment, S28 and S48 are rendered conductive when the potentials at connections 28 and 48 are pulled negative by more than a base-emitter potential $V_{BE}$ with respect to the supply rail V+ and are rendered nonconductive when those potentials approach supply voltage V+. An advantage of the type of switched-current gain amplifiers just described is that the control currents applied to the bases of switch transistors S28 and S48 are not coupled through to the operational amplifier terminal 70.

When the circuit of FIG. 2 is constructed in certain monolithic integrated circuit (IC) technologies, one must consider the effects of parasitic elements formed between the desired elements and the substrate. Such considerations are, of course, unnecessary when the circuit is constructed in discrete form or in an inherently isolating technology such as silicon-on-sapphire. In current amplifier 20A, a parasitic PNP transistor (not shown) could be formed having its emitter connected to Q28 base, having its base connected to Q28 collector and having its collector connected to substrate which connects to terminal 8. When S28 is nonconductive, Q28 collector potential can fall below that at its base tending to forward-bias the base-emitter junction of the parasitic PNP transistor and causing it to tend to conduct current from the base of Q28 to the substrate. That causes the current gain G between Q24 collector and output connection 24 to undesirably depart from unity.

Diodes D21 and D22 prevent the potential at Q28 collector from approaching its emitter potential more closely than does its base potential. While D21 is normally forward biased, D22 is poled so that it can become conductive if the Q28 collector potential falls towards that at output connection 24. D22 thereby prevents the parasitic PNP transistor from conducting when S28 is nonconductive by preventing saturation of Q28 in order to maintain substantially unity current gain. When S28 conducts, connecting Q28 collector to supply voltage V+ at connection 26, D22 is reverse biased so substantially no current flows therethrough and the current gain of Q26-Q28 is thereby substantially $(1+n)$.

Diodes D41 and D42 perform a similar function with respect to Q48 and its associated parasitic PNP transistor.

Figure 3:
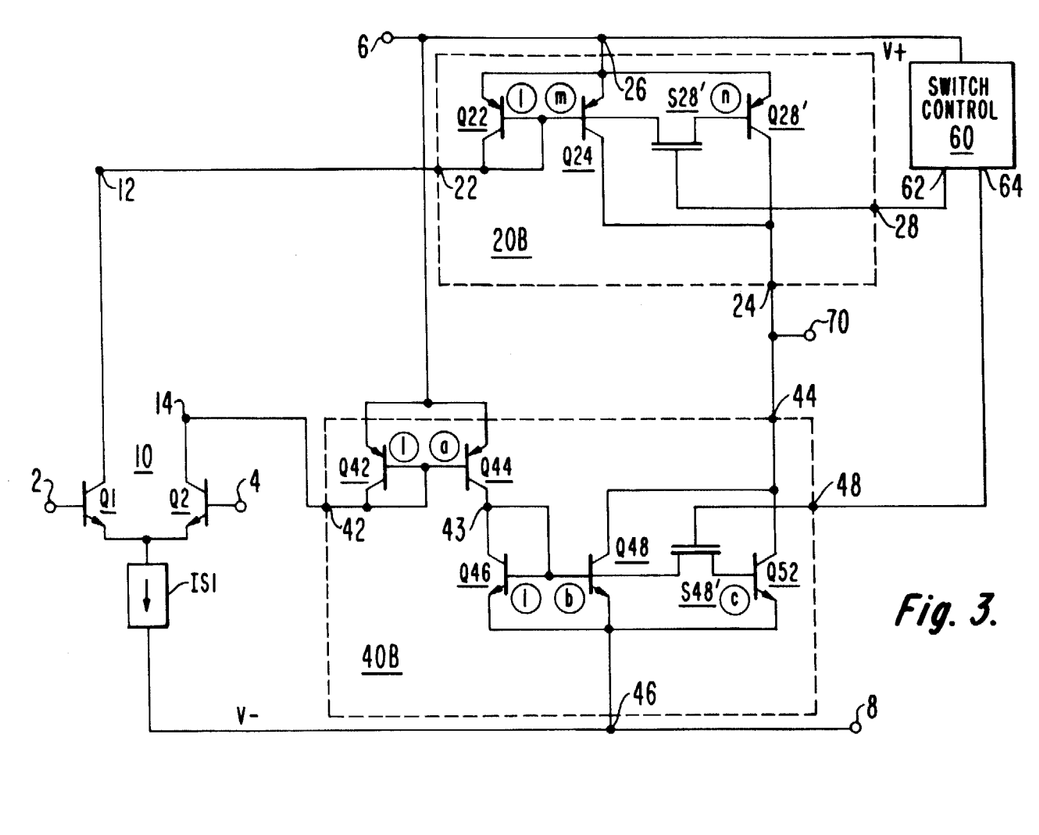

In the embodiment of FIG. 3, differential-input amplifier 10 is the same as that of FIG. 1.

Switched-gain current amplifier 20B includes a CMA having input transistor Q22 receiving drive current from input connection 22 and having output mirroring transistors Q24 and Q28' for taking output current from supply rail V+ connecting to supply connection 26 and output terminal 70 via output connection 24.

When switch S28' is nonconductive, Q28' supplies no current to output connection 24 and amplifier 20B exhibits current gain $G=m$. When S28' is conductive responsive to control signals at connection 28, Q28' supplies a current n times that in Q22 to output connection 24 where it is summed with the current from Q24 so the gain of current amplifier 20B is $G=(m+n)$. Amplifier 20B thus exhibits programmable current gain that is increased by the switching of additional output circuits responsive to the control signal at control connection 28.

Switched-gain current amplifier 40B includes a portion of similar form to amplifier 20B with complementary conductivity type transistors Q46, Q48, Q52 corresponding to transistors Q22, Q24, Q28', respectively, of amplifier 20B. Amplifier 40B further includes a CMA receiving drive current at input transistor Q42 and supplying current to input connection 43 from its output transistor Q44. When S48' is nonconductive, the current gain of amplifier 40B is $H=ab$. When the control signal at connection 48 renders S48' conductive, the collector current of Q52 is summed at output connection 44 with that of Q48 so the current gain increases to $H=a(b+c)$.

Usually the current gains of amplifier 20B and 40B are desired to be equal so the respective emitter areas are selected so that $a=1$, $m=b$, and $n=c$; the ratio m/n being selected to achieve the desired ratio among the programmable values of current gains G and H.

Switch control 60 supplies potentials of suitable magnitude and polarity from control outputs 62 and 64 to control connections 28 and 48, respectively, to render switches S28' and S48' selectively conductive. While S28' and S48' are shown as field-effect transistors (FETs), satisfactory switch function is obtained whether they are either P-channel or N-channel conductivity type or whether they operate in depletion- or enhancement-mode.

Figure 4:
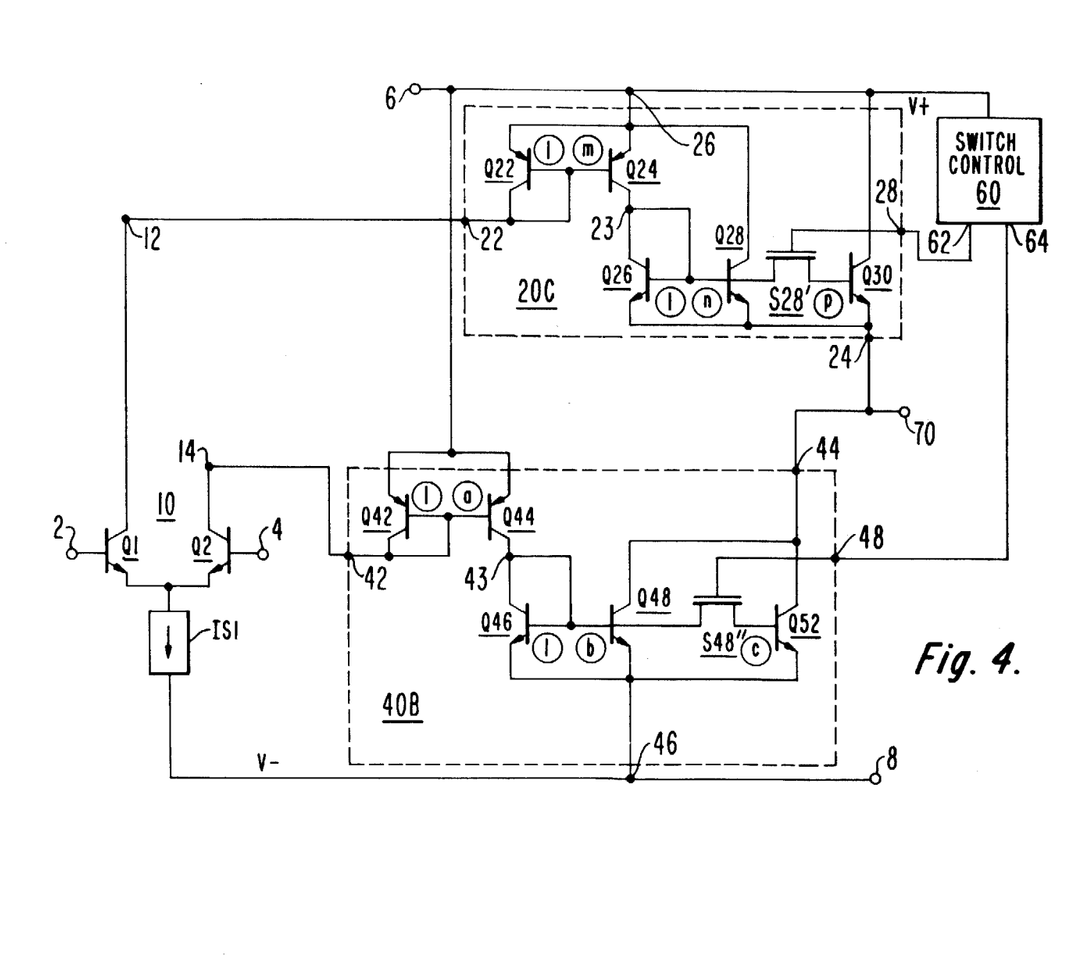

FIG. 4 shows an OTA with programmable gain that differs from the OTA of FIG. 3 in that switched-gain current amplifier 20C is of similar form to that of current amplifier 40B, with Q22, Q24, Q26, Q28, Q30, and S28' corresponding to Q42, Q44, Q46, Q48, Q52 and S48', respectively. It differs in that the collectors of Q28 and Q30 connect to supply rail V+ at 26 while output current is supplied to output terminal 70 via output connection 24 from the common connection of the Q26-Q28-Q30 CMA at the interconnection of their respective emitters.

When S28' is nonconductive, amplifier 20C exhibits current gain $G = m(1+n)$ between input connection 22 and output connection 24. When S28' is rendered conductive by the signal at control connection 28, the gain increases to $G = m(1+n+p)$ as a result of the summing of the respective currents from Q26, Q28 and Q30 at output connection 24. To make the values of gains G and H equal, transistor areas are selected as $m = a, (1+n) = b$, and $p = c$, for example.

The OTA of FIG. 4 desirably allows close matching between gains G and H owing to the similarity of structure as between current amplifiers 20C and 40B. That is particularly important when the OTA is constructed as a monolithic IC having vertical-NPN and lateral-PNP transistors the characteristics of which differ substantially. Thus, whatever differences exist as between NPN and PNP transistor characteristics and whatever errors are introduced thereby must affect amplifiers 20C and 40B to substantially equivalent degree.

Figure 5:
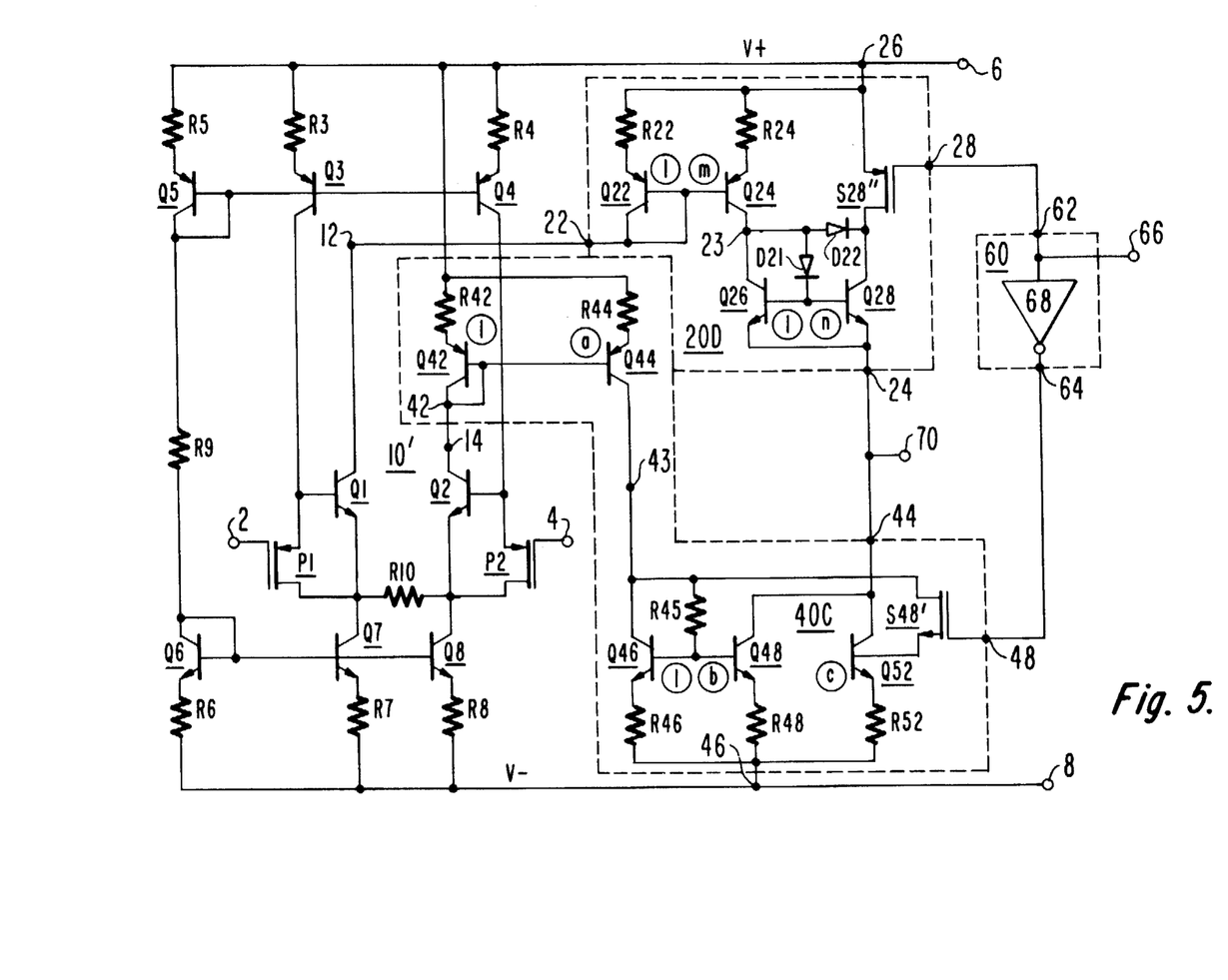

FIG. 5 shows a further embodiment of an operational amplifier with programmable gain employing a more complex differential-input amplifier 10' and current amplifiers 20D and 40C of different circuit configuration to illustrate that the various forms of switched-gain current amplifiers can be used interchangeably in OTAs according to the present invention. Differential-input amplifier 10' receives input signals from terminals 2 and 4 at the bases of Q1 and Q2 via source-follower action of P-FETs P1 and P2, respectively. Drive currents responsive thereto are supplied from the collectors of Q1 and Q2 to output connections 12 and 14. Tail currents for long-tailed pair Q1-Q2 and drain currents for P1-P2 are withdrawn by the collectors of Q7 and Q8, the current in resistor R10 being responsive to signals between terminals 2 and 4.

Quiescent operating currents for amplifier 10' are determined by current flow through resistor R9 respective to the difference between supply voltages V+ and V− and the value of R9, in accordance with Ohm's law. R9 current is mirrored by the Q6-Q7-Q8 CMA to supply tail current to long-tailed pair Q1-Q2 and by the Q5-Q3-Q4 CMA to supply drain-source current to P1 and P2. Emitter resistors R3, R4, R5, R6, R7, and R8 provide degeneration to linearize operation of the CMAs. The relative emitter areas of Q3 and Q4 are scaled so their collector current is a fraction of that supplied by Q7 and Q8. For example, with Q7 and Q8 each supplying one unit of current and Q3 and Q4 scaled to supply one-third unit of current, the P1 and P2 drain-source currents are each one-third unit while the Q1 and Q2 collector-emitter currents are each two-thirds unit.

Switched-gain current amplifier 20D differs from current amplifier 20A of FIG. 2 in that: emitter-resistors R22 and R24 are included to linearize the Q22-Q24 CMA; and P-channel FET S28″ selectively connects the collector of Q28 to relatively positive supply voltage V+.

Switched-gain current amplifier 40C differs from current amplifier 40B of FIG. 3 in that: emitter-resistors R42, R44, R46, R48 and R52 are included to linearize the Q42-Q44 and the Q46-Q48-Q52 CMAs; an N-channel FET S48' selectively connects the base of Q52 to input connection 43; and resistor R45 is included to exhibit substantially the same potential drop conducting base currents for Q46 and Q48 as does S48' channel resistance conducting base current to Q52.

The FIG. 5 OTA exhibits transconductance programmed responsive to digital control signals received at control input 66. Inverter 68 makes the control signal at output connection 64 complementary to that at 62 so that S28″ and S48' are rendered selectively conductive together and the programmed values G and H of current amplifiers 20D and amplifier 40C, respectively, increase and decrease together. Predetermined programmed values of G and H are determined by the selected emitter areas m, n, a, b, and c. When S28″ and S48' are nonconductive, the OTA is in its lower gain state with $G = m$ and $H = ab$. When S28″ and S48' are conductive, the OTA is in its increased gain state with $G = m(1+n)$ and its $H = a(b+c)$. Usually, the emitter areas are selected to make G and H substantially equal in each gain state. For example, selecting $b = 1$, $m = a = 4$, $n = c = 9$ establishes programmed values of G and H of 4 and 40, i.e. in the convenient ratio of 1:10.

Figure 6:
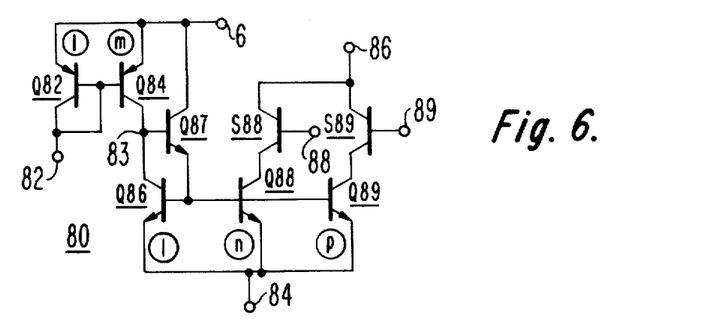
FIGS. 6 and 7 each show a switched-gain current amplifier suitable for replacing one or both of the switched-gain current amplifiers shown in the operational amplifiers of FIGS. 1-5.

FIG. 6 shows a further switched-gain current amplifier 80 suitable for replacing any of the switched-gain current amplifiers shown in FIGS. 2-5 in any of the above-described amplifiers. Current supplied to connection 83 from output transistor Q84 is m times the input current received at connection 82 by input transistor Q82. Q86 and Q88 form a CMA with an input connection at 83 similar to that described above for switched-gain current amplifier 20A but differing therefrom in that direct-coupled feedback from Q86 collector to the bases of Q86 and Q88 is provided by emitter-follower connected transistor Q87 in place of a direct connection. Q87 supplies base currents to Q86, Q88, and Q89 to substantially reduce errors caused by their base-currents. The collector of Q88 is selectively connected by switch S88, which can be either an NPN or PNP transistor, to a relatively positive potential at connection 86 responsive to a control potential or current supplied to connection 88. A further output circuit is formed by Q89, the collector of which is selectively connected to connection 86 by switch S89 responsive to control potential or current received at connection 89. The current amplifier thereby exhibits a plurality of current gains G responsive to a plurality of control signals.

When the current amplifier of FIG. 6 is used in position 20 in any of the preceeding FIGURES, connection 86 connects to supply terminal 6 and connection 84 connects to output terminal 70. When neither S88 nor S89 is conductive, current gain $G = m$; when S88 alone is conductive, $G = m(1+n)$; when S89 alone is conductive, current gain $G = m(1+p)$; and when both S88 and S89 are conductive, $G = m(1+n+p)$.

On the other hand, when the amplifier of FIG. 6 is used in position 40, output connection 86 connects to output terminal 70 and common connection 84 connects to relatively negative potential V− at supply terminal 8. When neither S88 nor S89 is conductive, current gain G=0; when S88 alone is conductive, G=mn; when S89 alone is conductive, G=mp; and when both S88 and S89 are conductive, G=m(n+p).

If the current amplifier of FIG. 6 is constructed in a monolithic IC technology where parasitic PNP transistors occur, the base-emitter junction of Q87 serves the function of diode D21 above and further diodes (not shown), interconnected at their anodes to the base of Q87, have their respective cathodes individually connected to the respective collectors of Q88, Q89 and so forth to serve the function of D22 above.

A desirable feature of the switched-gain current amplifiers of FIGS. 2 and 6 is that their switches do not "float" but are directly referenced to a supply rail, i.e. potential V+ at supply terminal 6, so that bipolar transistors of either NPN or PNP conductivity may be employed.

Figure 7:
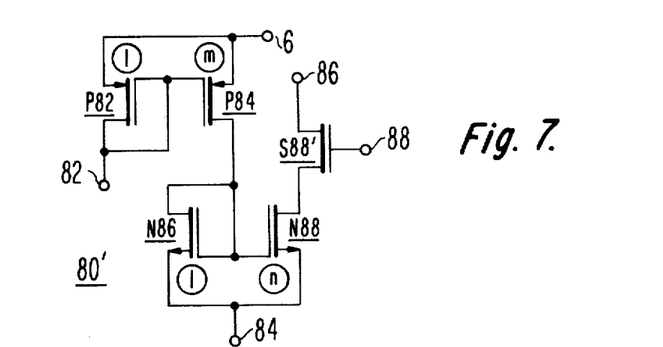

FIG. 7 is another switched-gain current amplifier suitable for replacing those shown above but employing FETs. In terms of amplifier 20A, P82 corresponds to Q22, P84 corresponds to Q24, and so forth. FIG. 7 also illustrates that any of the switched-gain current amplifiers described herein may employ either bipolar or field-effect transistors. As used in the claims, a bipolar base or FET gate is referred to as an input electrode, a bipolar emitter or FET source is referred to as a common electrode, and a bipolar collector or FET drain is referred to as an output electrode. Where either conductivity type transistor could be used, for example, as in switches S28 or S48, the transistors are designated as having merely first and second electrodes referring to either their output or common electrodes, and an input electrode.

While several embodiments of the present invention are described herein, one skilled in the art of design when armed with the teachings of this disclosure would be able to discern further embodiments. For example, an amplifier of the form of current amplifiers 20A, 20B, etc. could employ complementary conductivity transistors and be used in current amplifier location 40 referenced to relatively negative supply terminal 8. Similarly, an amplifier of the form of current amplifiers 40A, 40B, etc. could employ transistors of complementary conductivity to that shown and could be employed in the current amplifier position 20 referenced to relatively positive supply voltage V+ at terminal 6.

Accordingly, the invention is limited only by the claims below which should be broadly construed to include the full scope and spirit of the invention.

What is claimed is:

1. An amplifying circuit with switchable gain comprising:
   first and second supply terminals for receiving an operating potential therebetween;
   an output terminal;
   differential-input amplifying means receiving operating potential from said first and second supply terminals, having first and second input terminals at which first and second input signals are respectively received, and having first and second output connections from which first and second drive currents are supplied, varying responsive to the difference between said first and second input signals;
   first current amplifying means of a type having an input circuit for receiving said first drive current, having an output circuit connected between said first supply terminal and said output terminal for conducting current −G times as large as said first drive current, where G is a positive number, and responding to a first control signal to determine the value of said positive number G;
   second current amplifying means of a type having an input circuit for receiving said second drive current, having an output circuit connected between said output terminal and said second supply terminal for conducting current H times said second drive current where H is a positive number, and responding to a second control signal to determine the value of said positive number H; and
   means for selectively applying said first and second control signals to said first and second current amplifying means, respectively.

2. The amplifying circuit of claim 1 wherein said first current amplifying means comprises:
   current mirror amplifying means having input and common connections and its input circuit therebetween, its input circuit serving as the input circuit of said first current amplifying means, its common connection connecting to said output terminal, and having at least one output connection, an output circuit being defined between each output connection and its common connection; and
   switch means responding to said first control signal for selectively connecting a respective one of the output connections of said current mirror amplifying means to said first supply terminal.

3. The amplifying circuit of claim 2 wherein said current mirror amplifying means includes:
   a plurality of transistors of like conductivity type, each having output and common electrodes and a principal-conduction path therebetween, and each having an input electrode to which its principal-conduction path is responsive;
   means connecting the respective common electrodes of said transistors to the common connection of said current mirror amplifying means;
   means connecting the output electrode of a first one of said transistors to the input connection of said current mirror amplifying means;
   means connecting the respective output electrodes of the other ones of said transistors to the output connection of said current mirror amplifying means, at least one of which means includes said switch means;
   direct-coupled feedback means having an input connection at the output electrode of the first one of said transistors and an output connection at the input electrode thereof for establishing a potential thereat, to condition it to conduct a substantial portion of said first drive current; and
   means connecting the respective input electrodes of the other ones of said transistors to the input electrode of the first one of said transistors.

4. The amplifying circuit of claim 1 wherein said first current amplifying means comprises:
   current mirror amplifying means having input and common connections and its input circuit therebetween, its input circuit serving as the input circuit of said first current amplifying means, its common connection connecting to said output terminal, and having at least one output connection connected to said first supply terminal, an output circuit being defined between each output connection and its common connection; and switch means responding to said first control signal for selectively conditioning a respective one of the output circuits of said current mirror amplifying means for selectively conducting a current to increase the value of said positive number G.

5. The amplifying circuit of claim 4 wherein said current mirror amplifying means includes:
   a plurality of transistors of like conductivity type, each having output and common electrodes and a principal-conduction path therebetween, and each having an input electrode to which its principal-conduction path is responsive;
   means connecting the respective common electrodes of said transistors to the common connection of said current mirror amplifying means;
   means connecting the output electrode of a first one of said transistors to the input connection of said current mirror amplifying means;
   means connecting the respective output electrodes of the other ones of said transistors to the output connection of said current mirror amplifying means;
   direct-coupled feedback means having an input connection at the output electrode of the first one of said transistors and an output connection at the input electrode thereof for establishing a potential thereat to condition it to conduct a substantial portion of said first drive current; and
   means connecting the respective input electrodes of the other ones of said transistors to the input electrode of the first one of said transistors, at least one of which means includes said switch means.

6. The amplifying circuit of claim 1 wherein said first current amplifying means comprises:
   current mirror amplifying means having input and common connections and its input circuit therebetween, its input circuit serving as the input circuit of said first current amplifying means, its common connection connecting to said first supply terminal, and having at least one output connection, an output circuit being defined between each output connection and its common connection; and
   switch means responding to said first control signal for selectively connecting a respective one of the output connections of said current mirror amplifying means to said output terminal.

7. The amplifying circuit of claim 6 wherein said current mirror amplifying means includes:
   a plurality of transistors of like conductivity type, each having output and common electrodes and a principal-conduction path therebetween, and each having an input electrode to which its principal-conduction path is responsive;
   means connecting the respective common electrodes of said transistors to the common connection of said current mirror amplifying means;
   means connecting the output electrode of a first one of said transistors to the input connection of said current mirror amplifying means;
   means connecting the respective output electrodes of the other ones of said transistors to the output connection of said current mirror amplifying means, at least one of which means includes said switch means;
   direct-coupled feedback means having an input connection at the output electrode of the first one of said transistors and an output connection at the input electrode thereof for establishing a potential thereat to condition it to conduct a substantial portion of said first drive current; and
   means connecting the respective input electrodes of the other ones of said transistors to the input electrode of the first one of said transistors.

8. The amplifying circuit of claim 1 wherein said first current amplifying means comprises:
   current mirror amplifying means having input and common connections and its input circuit therebetween, its input circuit serving as the input circuit of said first current amplifying means, its common connection connecting to said first supply terminal, and having at least one output connection connected to said output terminal, an output circuit being defined between each output connection and its common connection; and
   switch means responding to said first control signal for selectively conditioning a respective one of the output circuits of said current mirror amplifying means for selectively conducting a current to increase the value of said positive number G.

9. The amplifying circuit of claim 8 wherein said current mirror amplifying means includes:
   a plurality of transistors of like conductivity type, each having output and common electrodes and a principal-conduction path therebetween, and each having an input electrode to which its principal-conduction path is responsive;
   means connecting the respective common electrodes of said transistors to the common connection of said current mirror amplifying means;
   means connecting the output electrode of a first one of said transistors to the input connection of said current mirror amplifying means;
   means connecting the respective output electrodes of the other ones of said transistors to the output connection of said current mirror amplifying means;
   direct-coupled feedback means having an input connection at the output electrode of the first one of said transistors and an output connection at the input electrode thereof for generating a potential thereat to condition it to conduct a substantial portion of said first drive current; and
   means connecting the respective input electrodes of the other ones of said transistors to the input electrode of the first one of said transistors, at least one of which means includes said switch means.

10. The amplifying circuit of claim 2, 3, 4, 5, 6, 7, 8 or 9 wherein said switch means includes a switch transistor having first and second electrodes and a principal-conduction path therebetween, and having a control electrode to which said first control signal is applied, the principal-conduction path of said switch transistor being rendered selectively conductive responsive to said first control signal.

11. The amplifying circuit of claim 1 wherein said first current amplifying means comprises:
   an input transistor having output and common electrodes and a principal-conduction path therebetween, and having an input electrode to which its principal-conduction path is responsive;
   direct-coupled feedback means having an input connection at the output electrode of said input transistor and having an output connection at the input electrode thereof for establishing a potential thereat to condition said input transistor to conduct a current in its principal-conduction path;

means connecting the principal-conduction path of said input transistor for receiving said first drive current;

at least one further transistor having output and common electrodes and a principal-conduction path therebetween, and having an input electrode to which its principal-conduction path is responsive; and means for selectively connecting said further transistor with its principal-conduction path connecting said first supply terminal to said output terminal, with its input electrode to the input electrode of said input transistor, and with its common electrode to the common electrode of said input transistor.

12. The amplifying circuit of claim 1 wherein said second current amplifying means comprises:

current mirror amplifying means having input and common connections and its input circuit therebetween, its input circuit serving as the input circuit of said second current amplifying means, its common connection connecting to said output terminal, and having at least one output connection, an output circuit being defined between each output connection and its common connection; and switch means responding to said second control signal for selectively connecting a respective one of the output connections of said current mirror amplifying means to said second supply terminal.

13. The amplifying circuit of claim 12 wherein said current mirror amplifying means includes:

a plurality of transistors of like conductivity type, each having output and common electrodes and a principal-conduction path therebetween, and each having an input electrode to which its principal-conduction path is responsive;

means connecting the respective common electrodes of said transistors to the common connection of said current mirror amplifying means;

means connecting the output electrode of a first one of said transistors to the input connection of said current mirror amplifying means;

means connecting the respective output electrodes of the other ones of said transistors to the output connection of said current mirror amplifying means, at least one of which means includes said switch means;

direct-coupled feedback means having an input connection at the output electrode of the first one of said transistors and an output connection at the input electrode thereof for establishing a potential thereat; to condition it to conduct a substantial portion of said second drive current; and means connecting the respective input electrodes of the other ones of said transistors to the input electrode of the first of said transistors.

14. The amplifying circuit of claim 1 wherein said first current amplifying means comprises:

current mirror amplifying means having input and common connections and its input circuit therebetween, its input circuit serving as the input circuit of said second current amplifying means, its common connection connecting to said output terminal, and having at least one output connection connected to said second supply terminal, an output circuit being defined between each output connection and its common connection; and switch means responding to said second control signal for selectively conditioning a respective one of the output circuits of said current mirror amplifying means for selectively conducting a current to increase the value of said positive number H.

15. The amplifying circuit of claim 14 wherein said current mirror amplifying means includes:

a plurality of transistors of like conductivity type, each having output and common electrodes and a principal-conduction path therebetween, and each having an input electrode to which its principal-conduction path is responsive;

means connecting the respective common electrodes of said transistors to the common connection of said current mirror amplifying means;

means connecting the output electrode of a first one of said transistors to the input connection of said current mirror amplifying means;

means connecting the respective output electrodes of the other ones of said transistors to the output connection of said current mirror amplifying means;

direct-coupled feedback means having an input connection at the output electrode of the first one of said transistors and an output connection at the input electrode thereof for establishing a potential thereat to condition it to conduct a substantial portion of said second drive current; and means connecting the respective input electrodes of the other of said transistors to the input electrode of the first one of said transistors, at least one of which means includes said switch means.

16. The amplifying circuit of claim 1 wherein said second current amplifying means comprises:

current mirror amplifying means having input and common connections and its input circuit therebetween, its input circuit serving as the input circuit of said second current amplifying means, its common connection connecting to said second supply terminal, and having at least one output connection, an output circuit being defined between each output connection and its common connection; and switch means responding to said second control signal for selectively connecting a respective one of the output connections of said current mirror amplifying means to said output terminal.

17. The amplifying circuit of claim 16 wherein said current mirror amplifying means includes:

a plurality of transistors of like conductivity type, each having output and common electrodes and a principal-conduction path therebetween, and each having an input electrode to which its principal-conduction path is responsive;

means connecting the respective common electrodes of said transistors to the common connection of said current mirror amplifying means;

means connecting the output electrode of a first one of said transistors to the input connection of said current mirror amplifying means;

means connecting the respective output electrodes of the other ones of said transistors to the output connection of said current mirror amplifying means, at least one of which means includes said switch means;

direct-coupled feedback means having an input connection at the output electrode of the first one of said transistors and an output connection at the input electrode thereof for establishing a potential thereat to condition it to conduct a substantial portion of said second drive current; and means connecting the respective input electrodes of the other ones of said transistors to the input electrode of the first one of said transistors.

18. The amplifying circuit of claim 1 wherein said second current amplifying means comprises:
current mirror amplifying means having input and common connections and its input circuit therebetween, its input circuit serving as the input circuit of said second current amplifying means, its common connection connecting to said second supply terminal, and having at least one output connection connected to said output terminal, an output circuit being defined between each output connection and its common connection; and
switch means responding to said second control signal for selectively conditioning a respective one of the output circuits of said current mirror amplifying means for selectively conducting a current to increase the value of said positive number H.

19. The amplifying circuit of claim 18 wherein said current mirror amplifying means includes:
a plurality of transistors of like conductivity type, each having output and common electrodes and a principal-conduction path therebetween, and each having an input electrode to which its principal-conduction path is responsive;
means connecting the respective common electrodes of said transistors to the common connection of said current mirror amplifying means;
means connecting the output electrode of a first one of said transistors to the input connection of said current mirror amplifying means;
means connecting the respective output electrodes of the other ones of said transistors to the output connection of said current mirror amplifying means;
direct-coupled feedback means having an input connection at the output electrode of the first one of said transistors and an output connection at the input electrode thereof for generating a potential thereat to condition it to conduct a substantial portion of said second drive current; and
means connecting the respective input electrodes of the other ones of said transistors to the input electrode of the first one of said transistors, at least one of which means includes said switch means.

20. The amplifying circuit of claim 12, 13, 14, 15, 16, 17, 18 or 19 wherein said switch means includes a switch transistor having first and second electrodes and a principal-conduction path therebetween, and having a control electrode to which said second control signal is applied, the principal-conduction path of said switch transistor being rendered selectively conductive responsive to said second control signal.

21. The amplifying circuit of claim 1 wherein said second current amplifying means comprises:
an input transistor having output and common electrodes and a principal-conduction path therebetween, and having an input electrode to which its principal-conduction path is responsive;
direct-coupled feedback means having an input connection at the output electrode of said input transistor and having an output connection at the input electrode thereof for establishing a potential thereat to condition said input transistor to conduct a current in its principal-conduction path;
means connecting the principal-conduction path of said input transistor for receiving said second drive current;
at least one further transistor having output and common electrodes and a principal-conduction path therebetween, and having an input electrode to which its principal-conduction path is responsive; and
means for selectively connecting said further transistor with its principal-conduction path connecting said second supply terminal to said output terminal with its input electrode to the input electrode of said input transistor, and with its common electrode to the common electrode of said input transistor.

22. The amplifying circuit of claim 1 wherein said means for selectively applying includes:
a control input terminal for receiving a control input signal;
first and second control output connections from which said first and second control signals are supplied to said first and second current amplifying means, respectively;
means connected between said control terminal and said first and second control output connections for generating said first and second control signals responsive to said control input signal, said first and second control signals being of predetermined magnitude and direction sense to make said positive numbers G and H of said first and second current amplifying means, respectively, respond in related fashion to said control input signal.

23. The amplifying circuit of claim 22 wherein the control input signal has a plurality of states causing said positive numbers G and H to exhibit a plurality of respective values corresponding to the aforesaid states of said control input signal.

24. The amplifying circuit of claim 1, 22 or 23 wherein the value of said positive number G substantially equals the value of said positive number H.

* * * * *